United States Patent
Lin et al.

(10) Patent No.: US 11,289,311 B2
(45) Date of Patent: Mar. 29, 2022

(54) METHOD AND APPARATUS FOR REDUCING VACUUM LOSS IN AN ION IMPLANTATION SYSTEM

(71) Applicant: Taiwan Semiconductor Manufacturing Co., Ltd., Hsin-Chu (TW)

(72) Inventors: Tsung-Min Lin, Zhubei (TW); Fang-Chi Chien, Hsinchu (TW); Cheng-Yi Huang, Hsinchu (TW); Chao-Po Lu, Zhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/588,152

(22) Filed: Sep. 30, 2019

(65) Prior Publication Data

US 2020/0126774 A1    Apr. 23, 2020

Related U.S. Application Data

(60) Provisional application No. 62/749,604, filed on Oct. 23, 2018.

(51) Int. Cl.
*H01J 37/18* (2006.01)
*H01J 37/32* (2006.01)
*H01J 37/317* (2006.01)

(52) U.S. Cl.
CPC ........ *H01J 37/32743* (2013.01); *H01J 37/18* (2013.01); *H01J 37/32412* (2013.01); *H01J 37/3171* (2013.01)

(58) Field of Classification Search
CPC ....... H01J 2237/166; H01J 2237/24514; H01J 37/18; H01J 37/3171; H01J 37/32412; H01J 37/32743; H01J 2237/024
See application file for complete search history.

(56) References Cited

U.S. PATENT DOCUMENTS

| | | | | |
|---|---|---|---|---|
| 5,746,835 A * | 5/1998 | Turner | ................... | G01N 27/60 118/723 MW |
| 5,976,312 A * | 11/1999 | Shimizu | ............ | H01L 21/67063 156/345.55 |
| 6,437,351 B1 * | 8/2002 | Smick | ..................... | H01L 21/68 250/492.21 |
| 6,797,967 B1 * | 9/2004 | Tse | ...................... | H01J 37/3171 250/492.1 |
| 7,217,934 B2 * | 5/2007 | Mori | ................... | H01J 37/3171 250/440.11 |

(Continued)

*Primary Examiner* — Wyatt A Stoffa
(74) *Attorney, Agent, or Firm* — Duane Morris LLP

(57) ABSTRACT

A method and apparatus for dosage measurement and monitoring in an ion implantation system is disclosed. In one embodiment, a transferring system, includes: a vacuum chamber, wherein the vacuum chamber is coupled to a processing chamber; a shaft coupled to a ball screw, wherein the ball screw and the shaft are configured in the vacuum chamber; and a vacuum rotary feedthrough, wherein the vacuum rotary feedthrough comprises a magnetic fluid seal so as to provide a high vacuum sealing, and wherein the vacuum rotary feedthrough is configured through a first end of the vacuum chamber and coupled to the ball screw so as to provide a rotary motion on the ball screw.

20 Claims, 3 Drawing Sheets

(56) References Cited

U.S. PATENT DOCUMENTS

| | | | | |
|---|---|---|---|---|
| 8,853,647 B2* | 10/2014 | Ogashiwa | ............... | H01J 37/20 |
| | | | | 250/440.11 |
| 2003/0197133 A1* | 10/2003 | Turner | ................... | H01J 37/20 |
| | | | | 250/492.21 |
| 2005/0218336 A1* | 10/2005 | Mori | ..................... | H01J 37/20 |
| | | | | 250/440.11 |
| 2006/0027763 A1* | 2/2006 | Deak | ................. | H01L 21/67126 |
| | | | | 250/492.21 |
| 2006/0108536 A1* | 5/2006 | Hwang | ................... | G01K 1/08 |
| | | | | 250/397 |
| 2008/0054194 A1* | 3/2008 | Kim | .................. | H01J 37/32412 |
| | | | | 250/492.21 |
| 2010/0024723 A1* | 2/2010 | Hasegawa | ............... | H01L 21/68 |
| | | | | 118/500 |
| 2011/0215090 A1* | 9/2011 | Shimizu | ................... | H05B 6/02 |
| | | | | 219/651 |
| 2011/0311339 A1* | 12/2011 | Yasui | ................ | H01L 21/67201 |
| | | | | 414/217 |
| 2012/0121065 A1* | 5/2012 | Rogers | ................ | H01J 35/1017 |
| | | | | 378/51 |
| 2013/0068960 A1* | 3/2013 | Chang | .................... | H01L 22/10 |
| | | | | 250/394 |
| 2015/0122993 A1* | 5/2015 | Noji | ....................... | H01J 37/05 |
| | | | | 250/307 |
| 2019/0043686 A1* | 2/2019 | Bendahan | ........... | H01J 35/1024 |
| 2019/0131158 A1* | 5/2019 | Matsumoto | .......... | C23C 16/4401 |
| 2019/0390326 A1* | 12/2019 | Takei | ................ | H01L 21/68764 |
| 2020/0090965 A1* | 3/2020 | Miyashita | ............... | C23C 16/52 |

* cited by examiner

METHOD AND APPARATUS FOR REDUCING VACUUM LOSS IN AN ION IMPLANTATION SYSTEM

BACKGROUND

A dosage measurement of a semiconductor substrate in a processing chamber of an ion implantation system can be performed by monitoring an ion beam using a faraday cup moved by a transferring system. Since this process often encounters problems associated with vacuum loss in the processing chamber during the scanning of the substrate particularly at a vacuum seal attached to the transferring system. The change in the beam profile caused by the vacuum loss at a position is used as a reference value to correct the beam during implantation at the same position. However, during ion implantation a different vacuum loss can occur at the same position resulting in compensation error and causing a low yield in production. Therefore, there exists a need to reduce vacuum loss introduced to the processing chamber during the traveling of the Faraday cup system to prevent compensation error and improve the production yield.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

A dosage measurement in an ion implantation process can be performed by monitoring an ion beam with a faraday cup in a processing chamber, which is coupled to and positioned by a transferring system. A vacuum loss in the transferring system and eventually in the processing chamber can result in a dosage compensation error and further causing a low yield in production. This disclosure presents various embodiments of a method and apparatus for reducing the vacuum loss in the processing chamber of an ion implantation system with a transferring system.

Figure 1:
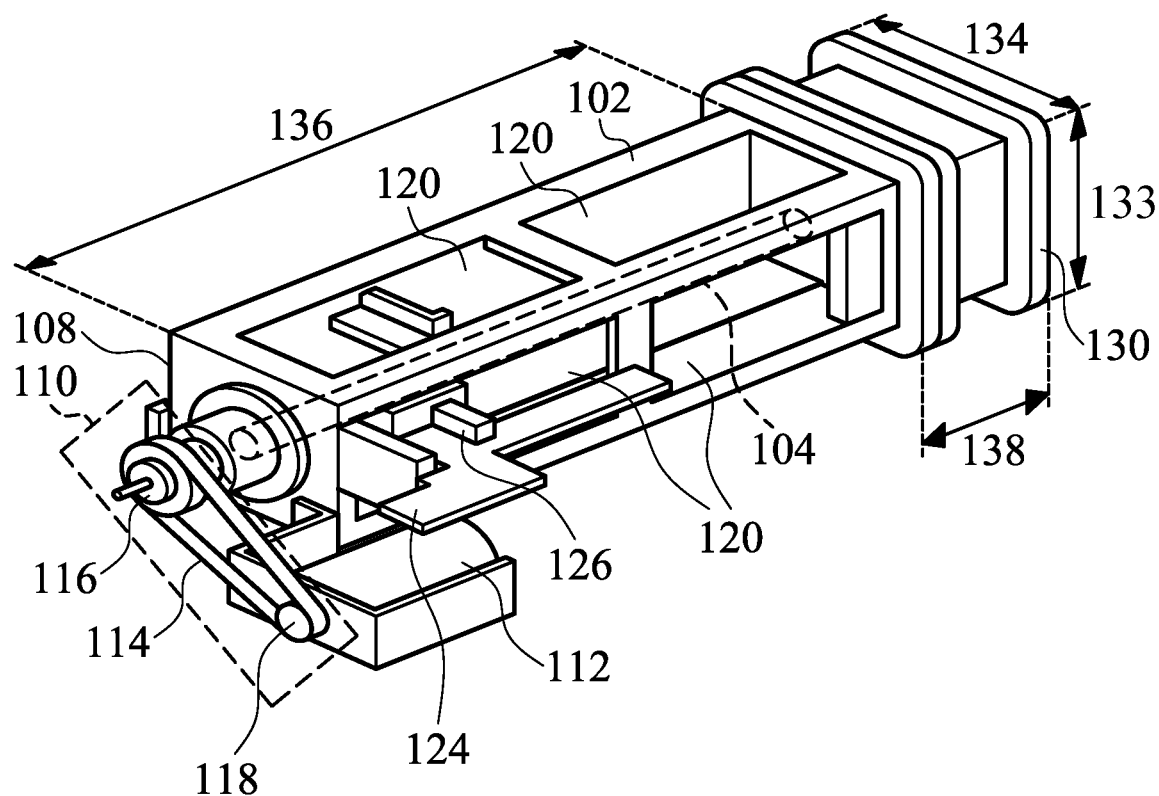
FIG. 1 illustrates an exemplary block diagram of a transferring system, in accordance with some embodiments of present disclosure
Figure 1:
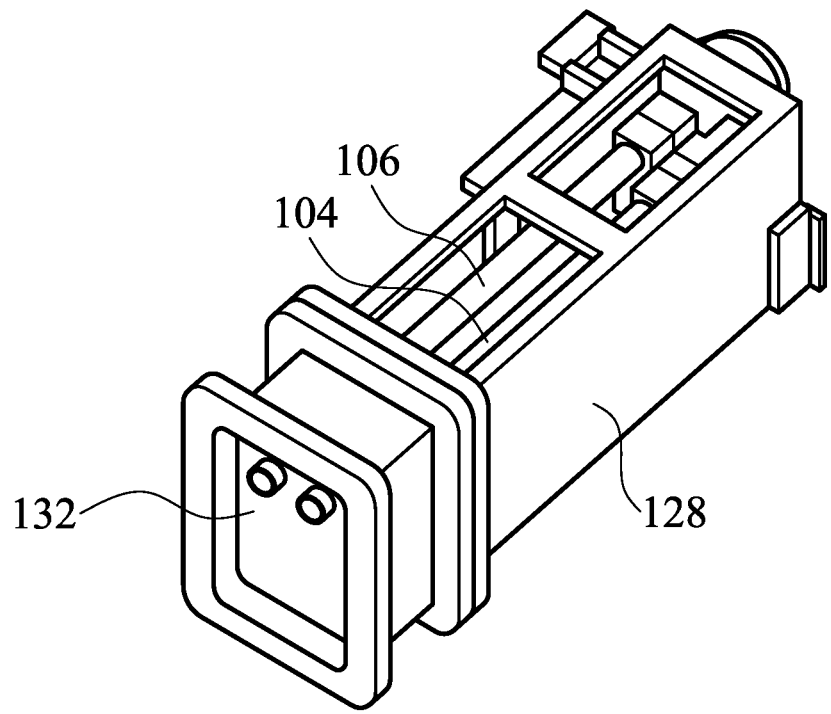

FIG. 1 illustrates an exemplary block diagram of a transferring system 100, in accordance with some embodiments of present disclosure. It is noted that the transferring system 100 is merely an example, and is not intended to limit the present disclosure. Accordingly, it is understood that additional functional blocks may be provided in or coupled to the transferring system 100 of FIG. 1, and that some other functional blocks may only be briefly described herein.

In some embodiments, the transferring system 100 comprises a vacuum chamber 102, a ball screw 104, a shaft 106, and a vacuum rotary feedthrough 108. In some embodiments, the vacuum chamber 102 comprises at least one viewing window 120, at least one BNC (Bayonet Neill-Concelman) connector 128, a sensor 126 and a sensor bracket 124. In some embodiments, the vacuum chamber 102 is attached to a processing chamber (not shown) through an adaptor head 130. In some embodiments, the vacuum chamber 102 has a length 136 of 497.55 millimeters, a width 134 of 166.7 millimeters and a height 133 of 217 millimeters. In some embodiments, the processing chamber is a vacuum chamber for ion implantation. In some embodiments, the vacuum chamber 102 comprises aluminum alloy. In some embodiments, the vacuum chamber 102 is coupled to the processing chamber through an adaptor head 130. In some embodiments, the adaptor head 130 has a length 138 of 110.75 millimeters, a width 134 of 166.7 millimeters and a height 133 of 217 millimeters. In some embodiments, the adaptor head 130 comprises aluminum alloy. In some embodiments, the vacuum chamber 102 is pumped to vacuum through the vacuum processing system attached to the processing chamber without using a differential seal in which a differential pump is attached.

In some embodiments, the at least one viewing window 120 on the vacuum chamber 102 comprises a thermoplastic plastic material, for example poly (methl methacrylate), known as acrylic glass. In some embodiments, the acrylic glass is transparent. In some embodiments, the acrylic glass viewing window on the vacuum chamber 102 has a thickness of 15 millimeters, a length of 228 millimeters and a width of 140 millimeters. In some other embodiments, the acrylic glass viewing window on the vacuum chamber 102 has a thickness of 15 millimeters, a length 228 millimeters and a width of 80 millimeters.

In some embodiments, the at least one BNC connector 128 on the vacuum chamber 102 is to communicate with a Faraday cup (not shown) in a processing chamber. In some embodiments, the at least one BNC connector 128 is configured through the wall of the vacuum chamber 102 with an o-ring seal for maintaining the vacuum. In some embodiments, the sensor bracket 124 is to support the sensor 126 outside the vacuum chamber 102. In some embodiments, the sensor 126 is a laser position sensor used to determine the position of the faraday cup in the processing chamber. In some embodiments, the sensor bracket 124 allows an adjustment of the position of the sensor 126 along the length of a viewing window 120.

In some embodiments, the ball screw 104 is coupled to the shaft 106 in the vacuum chamber 102. In some embodiments, the ball screw 104 is a mechanical device that translate rotational motion to linear motion. In some embodiments, the ball screw 104 has a length smaller than a summation of the length 136 and the length 138. In some embodiments, the length of the ball screw 104 equals to 605.33 millimeters. In some embodiments, a diameter of the ball screw 104 is 12.7 millimeters. In some embodiments, the ball screw 104 comprises a nut, a screw with helical grooves, and balls. In some embodiments, the balls roll between nuts, screw and grooves to provide an accurate, continuous reliable and efficient mechanical translation and positioning of the Faraday cup (not shown) attached to one end 132 of the shaft 106.

In some embodiments, the vacuum rotary feedthrough 108 comprises a magnetic fluid seal for high vacuum sealing. In some embodiments, the magnetic fluid seal comprises magnetic fluid, also known as magnetized liquid, which is a liquid that is attracted to magnets. In some embodiments, the magnetic fluid in a vacuum rotary feedthrough comprises three components: magnetic particles, surfactant and a base liquid. In some embodiments, the magnetic fluid is a colloidal liquid comprising nano-sized magnetic particles distributed through a liquid body.

In some embodiments, the performance of a magnetic fluid seal is determined by the properties of the magnetic fluid. In some embodiments, the surfactant is to maintain the magnetic particles evenly distributed and mixed with the base liquid. The surfactant envelops the magnetic particles and causes them to oppose one another within the base liquid, which prevents settlement and maintains a uniform distribution of magnetic particles. In some embodiments, the base liquid comprises one of the following: Alkyl naphthalene and perfluoropholyether, for different levels of vacuum seals, temperature and corrosion-resistance requirements. In some embodiments, the magnetic fluid seal is used to directly allow extremely high vacuum in the attached vacuum chamber via direct exhaust from the main processing chamber without the use of traditional differential pumping seal. Therefore, the compensation error in an ion implantation system caused by interactions (e.g., ionization, charge exchange and electron stripping) between residual gas molecules and implant ions when a vacuum leakage occurs in the system especially at the differential pumping seal can be reduced.

In some embodiments, the magnetic fluid seal is filled with magnetic fluid that is oriented with the magnetic force lines created by the shaft, magnet and pole pieces. The sealing action is provided by a sealing skin, i.e., liquid O ring that is formed by the magnetic fluid in the gaps between the shaft and the pole pieces to keep a vacuum and meanwhile, to provide rotational power to the attached vacuum chamber with the shaft and the ball screw to provide scanning motion to the faraday cup attached to one end of the shaft. In some embodiments, the advantages of magnetic fluid seal further comprises superior longevity to solid seals, self-repairing, minimal levels of dust and contamination, and lower torque due to the absence of abrasion.

In some embodiments, the magnetic fluid vacuum seal comprises a plurality of stages of magnetic fluid seals to provide successive stages for creating an equilibrium that maintains the vacuum seal. In some embodiments, the magnetic fluid vacuum seal further comprises at least one dust seal and at least one shaft. In some embodiments, the at least one dust seal is to shut out dirt and contaminants from the atmosphere, as well as contaminants generated by bearing grease. In some other embodiments, the magnetic fluid seal may further comprise a cooling system.

In some embodiments, the rotational power to the shaft of the magnetic fluid vacuum seal 108 is provided by coupling a mechanical motor 112 through a coupling mechanism 110. In some embodiments, the coupling mechanism 110 comprise at least a belt 114 and a gear couple 116/118. In some embodiments, the mechanical motor 112 and the coupling mechanism 110 are positioned outside of the attached vacuum chamber. In some embodiments, the rotational speed and direction of the ball screw 104 and thus the Faraday cup (not shown) attached to the shaft 106 in the attached vacuum chamber 102 on the end 132 can be controlled by directly adjusting the speed and direction of the mechanical motor 112.

In some embodiments, the Faraday cup (not shown) in an ion implantation system is configured for profile scan to determine a size and shape of an ion beam at different positions in the processing chamber. In some embodiments, the ion beam is generated by an ion source, extracted by a resolving aperture, focused by a magnetic quadruple focusing lens, deflected by an electrostatic deflector, and accelerated in an acceleration column. Data collected by the Faraday cup which is moved along with the shaft is transmitted to a dose integrator controller. In some embodiments, the data is then analyzed by a computer unit to determine compensation levels at different positions so as to control the uniformity of the ion implantation in a substrate.

Figure 2:
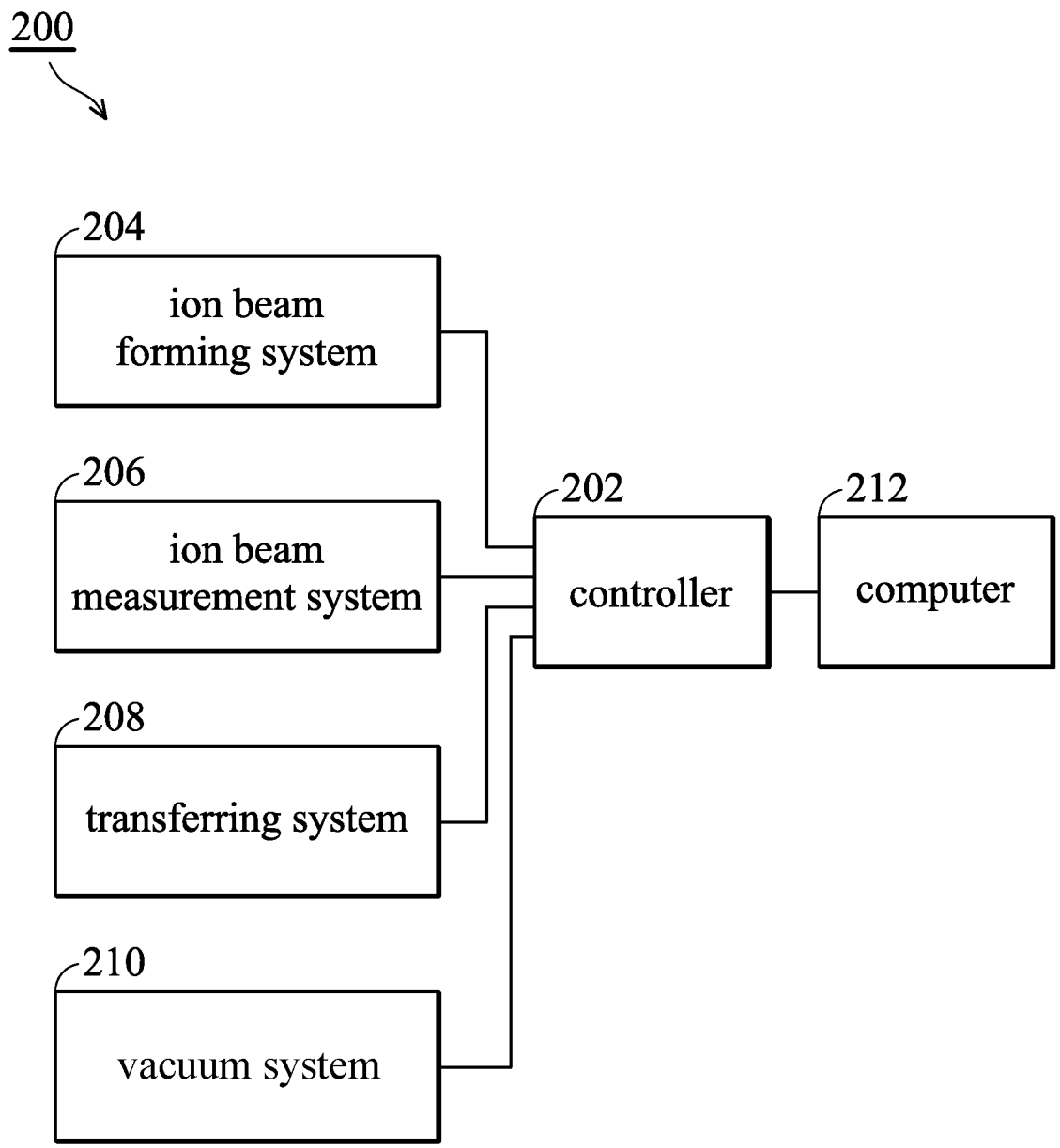
FIG. 2 illustrates a block diagram of an ion implantation system with a transferring system, in accordance with some embodiments of the present disclosure.

FIG. 2 illustrates a block diagram of an ion implantation system 200 with a transferring system, in accordance with some embodiments of the present disclosure. In the illustrated embodiments, the ion implantation system 200 comprises a controller 202, an ion beam forming system 204, an ion beam measurement system 206, a transferring system 208, and a vacuum system 210. In some embodiments, the ion beam forming system 204, the ion beam measurement system 206, the transferring system 208 and the vacuum system 210 are coupled to a computer 212 through the controller 202.

The controller 202 is a representative device and may comprise a processor, a memory, an input/output interface, a communications interface, and a system bus. The processor may comprise any processing circuitry operative to control the operations and performance of the controller 202 of the system 200. In various aspects, the processor may be implemented as a general purpose processor, a chip multiprocessor (CMP), a dedicated processor, an embedded processor, a digital signal processor (DSP), a network processor, an input/output (I/O) processor, a media access control (MAC) processor, a radio baseband processor, a co-processor, a microprocessor such as a complex instruction set computer (CISC) microprocessor, a reduced instruction set computing (RISC) microprocessor, and/or a very long instruction word (VLIW) microprocessor, or other processing device. The processor also may be implemented by a controller, a microcontroller, an application specific integrated circuit (ASIC), a field programmable gate array (FPGA), a programmable logic device (PLD), and so forth.

In various aspects, the processor may be arranged to run an operating system (OS) and various applications. Examples of an OS comprise, for example, operating systems generally known under the trade name of Apple OS, Microsoft Windows OS, Android OS, and any other proprietary or open source OS. Examples of applications comprise, for example, a telephone application, a camera (e.g., digital camera, video camera) application, a browser application, a multimedia player application, a gaming application, a messaging application (e.g., email, short message, multimedia), a viewer application, and so forth.

In some embodiments, at least one non-transitory computer-readable storage medium is provided having computer-executable instructions embodied thereon, wherein, when executed by at least one processor, the computer-executable instructions cause the at least one processor to perform embodiments of the methods described herein. This computer-readable storage medium can be embodied in the memory.

In some embodiments, the memory may comprise any machine-readable or computer-readable media capable of storing data, including both volatile/non-volatile memory and removable/non-removable memory. The memory may comprise at least one non-volatile memory unit. The non-volatile memory unit is capable of storing one or more software programs. The software programs may contain, for example, applications, user data, device data, and/or configuration data, or combinations therefore, to name only a few. The software programs may contain instructions executable by the various components of the controller 202 of the system 200.

For example, memory may comprise read-only memory (ROM), random-access memory (RAM), dynamic RAM (DRAM), Double-Data-Rate DRAM (DDR-RAM), synchronous DRAM (SDRAM), static RAM (SRAM), programmable ROM (PROM), erasable programmable ROM (EPROM), electrically erasable programmable ROM (EEPROM), flash memory (e.g., NOR or NAND flash memory), content addressable memory (CAM), polymer memory (e.g., ferroelectric polymer memory), phase-change memory (e.g., ovonic memory), ferroelectric memory, silicon-oxide-nitride-oxide-silicon (SONOS) memory, disk memory (e.g., floppy disk, hard drive, optical disk, magnetic disk), or card (e.g., magnetic card, optical card), or any other type of media suitable for storing information.

In one embodiment, the memory may contain an instruction set, in the form of a file for executing a method of generating one or more timing libraries as described herein. The instruction set may be stored in any acceptable form of machine-readable instructions, including source code or various appropriate programming languages. Some examples of programming languages that may be used to store the instruction set comprise, but are not limited to: Java, C, C++, C#, Python, Objective-C, Visual Basic, or .NET programming. In some embodiments a compiler or interpreter is comprised to convert the instruction set into machine executable code for execution by the processor.

In some embodiments, the I/O interface may comprise any suitable mechanism or component to at least enable a user to provide input to the controller 202 of the system 200 and the controller 202 of the system 200 to provide output to the user. For example, the I/O interface may comprise any suitable input mechanism, including but not limited to, a button, keypad, keyboard, click wheel, touch screen, or motion sensor. In some embodiments, the I/O interface may comprise a capacitive sensing mechanism, or a multi-touch capacitive sensing mechanism (e.g., a touchscreen).

In some embodiments, the I/O interface may comprise a visual peripheral output device for providing a display visible to the user. For example, the visual peripheral output device may comprise a screen such as, for example, a Liquid Crystal Display (LCD) screen, incorporated into the controller 202 of the system 200. As another example, the visual peripheral output device may comprise a movable display or projecting system for providing a display of content on a surface remote from the controller 202 of the system 200. In some embodiments, the visual peripheral output device can comprise a coder/decoder, also known as a Codec, to convert digital media data into analog signals. For example, the visual peripheral output device may comprise video Codecs, audio Codecs, or any other suitable type of Codec.

The visual peripheral output device also may comprise display drivers, circuitry for driving display drivers, or both. The visual peripheral output device may be operative to display content under the direction of the processor. For example, the visual peripheral output device may be able to play media playback information, application screens for applications implemented on the controller 202 of the system 200, information regarding ongoing communications operations, information regarding incoming communications requests, or device operation screens, to name only a few.

In some embodiments, the communications interface may comprise any suitable hardware, software, or combination of hardware and software that is capable of coupling the controller 202 of the system 200 to one or more networks and/or additional devices. The communications interface may be arranged to operate with any suitable technique for controlling information signals using a desired set of communications protocols, services or operating procedures. The communications interface may comprise the appropriate physical connectors to connect with a corresponding communications medium, whether wired or wireless.

Systems and methods of communication comprise a network, in accordance with some embodiments. In various aspects, the network may comprise local area networks (LAN) as well as wide area networks (WAN) including without limitation Internet, wired channels, wireless channels, communication devices including telephones, computers, wire, radio, optical or other electromagnetic channels, and combinations thereof, including other devices and/or components capable of/associated with communicating data. For example, the communication environments comprise in-body communications, various devices, and various modes of communications such as wireless communications, wired communications, and combinations of the same.

Wireless communication modes comprise any mode of communication between points (e.g., nodes) that utilize, at least in part, wireless technology including various protocols and combinations of protocols associated with wireless transmission, data, and devices. The points comprise, for example, wireless devices such as wireless headsets, audio and multimedia devices and equipment, such as audio players and multimedia players, telephones, including mobile telephones and cordless telephones, and computers and computer-related devices and components, such as printers, network-connected machinery such as a circuit generating system 404, and/or any other suitable device or third-party device.

Wired communication modes comprise any mode of communication between points that utilize wired technology including various protocols and combinations of protocols associated with wired transmission, data, and devices. The points comprise, for example, devices such as audio and multimedia devices and equipment, such as audio players and multimedia players, telephones, including mobile telephones and cordless telephones, and computers and computer-related devices and components, such as printers, network-connected machinery, and/or any other suitable device or third-party device. In various implementations, the wired communication modules may communicate in accordance with a number of wired protocols. Examples of wired protocols may comprise Universal Serial Bus (USB) communication, RS-232, RS-422, RS-423, RS-485 serial protocols, FireWire, Ethernet, Fiber Channel, MIDI, ATA, Serial ATA, PCI Express, T-1 (and variants), Industry Standard Architecture (ISA) parallel communication, Small Computer System Interface (SCSI) communication, or Peripheral Component Interconnect (PCI) communication, to name only a few examples.

Accordingly, in various aspects, the communications interface may comprise one or more interfaces such as, for example, a wireless communications interface, a wired communications interface, a network interface, a transmit interface, a receive interface, a media interface, a system interface, a component interface, a switching interface, a chip interface, a controller, and so forth. When implemented by a wireless device or within wireless system, for example, the communications interface may comprise a wireless interface comprising one or more antennas, transmitters, receivers, transceivers, amplifiers, filters, control logic, and so forth.

In various embodiments, the communications interface may provide voice and/or data communications functionality in accordance a number of wireless protocols. Examples of wireless protocols may comprise various wireless local area network (WLAN) protocols, including the Institute of Electrical and Electronics Engineers (IEEE) 802.xx series of protocols, such as IEEE 802.11a/b/g/n, IEEE 802.16, IEEE 802.20, and so forth. Other examples of wireless protocols may comprise various wireless wide area network (WWAN) protocols, such as GSM cellular radiotelephone system protocols with GPRS, CDMA cellular radiotelephone communication systems with 1×RTT, EDGE systems, EV-DO systems, EV-DV systems, HSDPA systems, and so forth. Further examples of wireless protocols may comprise wireless personal area network (PAN) protocols, such as an Infrared protocol, a protocol from the Bluetooth Special Interest Group (SIG) series of protocols, including Bluetooth Specification versions v1.0, v1.1, v1.2, v2.0, v2.0 with Enhanced Data Rate (EDR), as well as one or more Bluetooth Profiles, and so forth. Yet another example of wireless protocols may comprise near-field communication techniques and protocols, such as electromagnetic induction (EMI) techniques. An example of EMI techniques may comprise passive or active radio-frequency identification (RFID) protocols and devices. Other suitable protocols may comprise Ultra Wide Band (UWB), Digital Office (DO), Digital Home, Trusted Platform Module (TPM), ZigBee, and so forth.

In some embodiments, the controller 202 of the system 200 may comprise a system bus that couples various system components including the processor, the memory, and the I/O interface. The system bus can be any of several types of bus structure(s) including a memory bus or memory controller, a peripheral bus or external bus, and/or a local bus using any variety of available bus architectures including, but not limited to, 9-bit bus, Industrial Standard Architecture (ISA), Micro-Channel Architecture (MCA), Extended ISA (EISA), Intelligent Drive Electronics (IDE), VESA Local Bus (VLB), Personal Computer Memory Card International Association (PCMCIA) Bus, Small Computer System Interface (SCSI) or other proprietary bus, or any custom bus suitable for computing device applications.

In some embodiments, the ion implantation system 204 comprises an ion source, extraction electrodes, magnets, and a plurality of lenses for beam scanning, parallelizing and charge control. In some embodiments, the ion source is configured to convert atoms into ions. In some embodiments, the ion source is an arc discharge plasma using electrons generated from a heated metal wire. In some other embodiments, the ion source is a filament-less ion source provided by microwave or RF frequency excitation of ions. In some embodiments, the extraction electrodes are configured to draw positive ions from a plasma by applying a relatively negative bias. In some embodiments, the magnets are used to focus the ion beam with a desired shape and size. In some embodiments, the ion beam is scanned and paralleled through the plurality of lenses to allow the ion beam to scan over a wafer surface. In some embodiments, the ion implantation system 204 further comprises a plurality of electrodes to accelerate or decelerate ions.

In some embodiments, the transferring system 208 comprises a first transferring system for traveling faraday cup and a second transferring system for substrate wafers. In some embodiments, the first transferring system for transferring a faraday cup for beam profile measurement and beam monitoring. In some embodiments, the first transferring system comprises a vacuum chamber 102, a ball screw 104, a shaft 106, and a vacuum rotary feedthrough 108. In some embodiments, the vacuum chamber 102 is attached to a processing chamber (not shown) through an adaptor head 130. In some embodiments, the vacuum chamber 102 comprises aluminum alloy. In some embodiments, the vacuum chamber 102 is coupled to the processing chamber through an adaptor head 130. In some embodiments, the vacuum chamber 102 is pumped to vacuum through the vacuum system 210 attached to the processing chamber. In some embodiments, the at least one viewing window 120 on the vacuum chamber 102 comprises a thermoplastic plastic material, for example poly (methl methacrylate), known as acrylic glass. In some embodiments, the acrylic glass is transparent.

In some embodiments, the ball screw 104 is coupled to the shaft 106 in the vacuum chamber 102. In some embodiments, the ball screw 104 is a mechanical device that translate rotational motion to linear motion. In some embodiments, the ball screw 104 comprises a nut, a screw with helical grooves, and balls. In some embodiments, the balls roll between nuts, screw and grooves to provide an accurate, continuous reliable and efficient mechanical translation and positioning of the Faraday cup (not shown) attached to one end 132 of the shaft 106. In some embodiments, the vacuum rotary feedthrough 108 comprises a magnetic fluid seal for high vacuum sealing. In some embodiments, the magnetic fluid seal comprises magnetic fluid, also known as magnetized liquid, which is a liquid that is attracted to magnets. In some embodiments, the magnetic fluid in a vacuum rotary feedthrough comprises three components: magnetic particles, surfactant and a base liquid. In some embodiments, the magnetic fluid is a colloidal liquid comprising nano-sized magnetic particles distributed through a liquid body. In some embodiments, the magnetic fluid vacuum seal comprises a plurality of stages of magnetic fluid seals to provide successive stages for creating an equilibrium that maintains the vacuum seal. In some embodiments, the rotational power to the shaft of the magnetic fluid vacuum seal 108 is provided by coupling a mechanical motor 112 through a coupling mechanism 110. In some embodiments, the coupling mechanism 110 comprise at least a belt 114 and a gear couple 116/118. In some embodiments, the mechanical motor 112 and the coupling mechanism 110 are positioned outside of the attached vacuum chamber.

Figure 3:
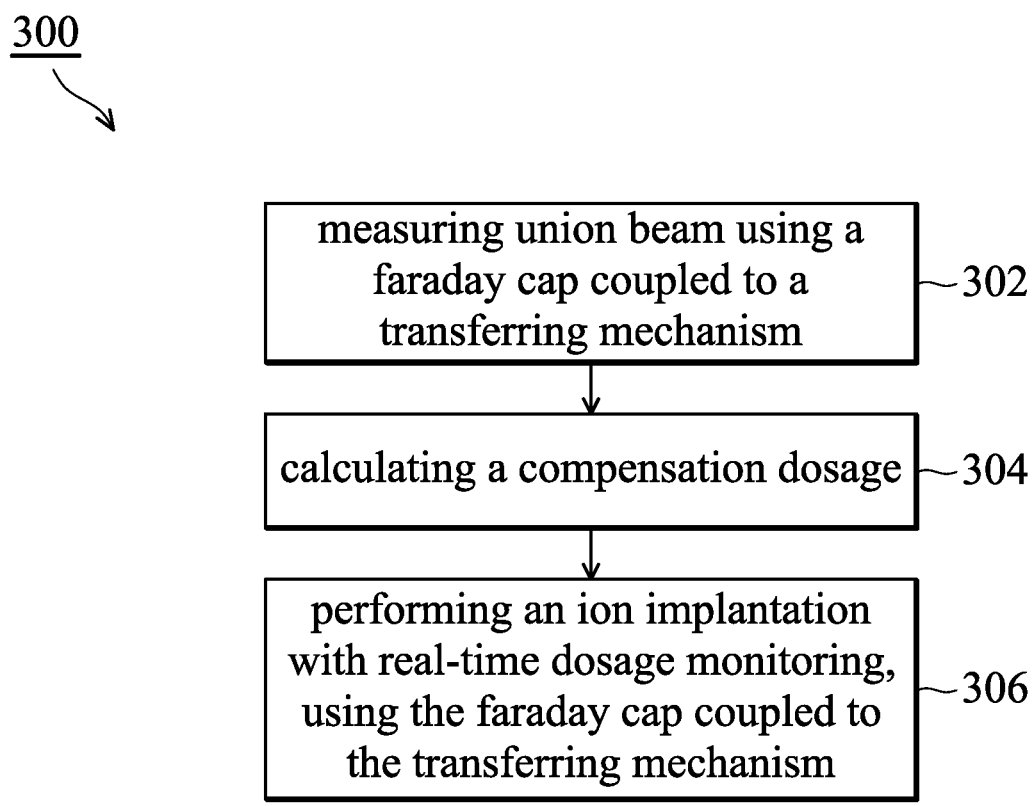
FIG. 3 illustrates a flow chart of a method to measure a beam profile and perform an ion implantation using a transferring system, in accordance with some embodiments of present disclosure.

FIG. 3 illustrates a flow chart of a method 300 to measure a beam profile and perform an ion implantation using a transferring system 100, in accordance with some embodiments of present disclosure. In some embodiments, the operations of method 300 are performed by the respective components illustrated in FIGS. 1 and 2. For purposes of discussion, the following embodiment of the method 300 will be described in conjunction with FIGS. 1 and 2. The illustrated embodiment of the method 300 is merely an example for generating a masking map. Therefore, it should be understood that any of a variety of operations may be omitted, re-sequenced, and/or added while remaining within the scope of the present disclosure.

The method 300 starts with operation 302 in which an ion beam profile is measured using a Faraday cup according to some embodiments. In some embodiments, the ion beam is deflected by a deflector to different positions and ion beams at different positions are measured by the Faraday cup in an ion implantation processing chamber. In some embodiments, a current at a corresponding position from the Faraday cup is used to determine the ion beam profile at the corresponding position. In some embodiments, positive ions captured by the Faraday cup is neutralized by electrons supplied to the Faraday cup. In some embodiments, ion beam profiles at least three different positions in the ion implantation system are measured by the Faraday cup.

In some embodiments, the Faraday cup is coupled to and moved by a transferring system 100 through a shaft 106, wherein the shaft 106 is located in a vacuum chamber 102 attached to the ion implantation processing chamber. In some embodiments, the vacuum chamber 102 is pumped to vacuum through the vacuum processing system attached to the processing chamber without using a differential seal in which a differential pump is attached. In some embodiments, the shaft 106 is moved by a ball screw 104. In some embodiments, the ball screw 104 is a mechanical device that translate rotational motion to linear motion. In some embodiments, the ball screw 104 has a length smaller than a summation of the length 136 and the length 138. In some embodiments, the length of the ball screw 104 equals to 605.33 millimeters. In some embodiments, a diameter of the ball screw 104 is 12.7 millimeters. In some embodiments, the ball screw 104 comprises a nut, a screw with helical grooves, and balls. In some embodiments, the balls roll between nuts, screw and grooves to provide an accurate, continuous reliable and efficient mechanical translation and positioning of the Faraday cup (not shown) attached to one end 132 of the shaft 106.

In some embodiments, the vacuum rotary feedthrough 108 comprises a magnetic fluid seal for high vacuum sealing. In some embodiments, the magnetic fluid seal comprises magnetic fluid, also known as magnetized liquid, which is a liquid that is attracted to magnets. In some embodiments, the magnetic fluid in a vacuum rotary feedthrough comprises three components: magnetic particles, surfactant and a base liquid. In some embodiments, the magnetic fluid is a colloidal liquid comprising nano-sized magnetic particles distributed through a liquid body.

The method 300 continues with operation 304 in which a dosage compensation is calculated based on the measured beam profile, according to some embodiments. In some embodiments, the computer 212 is used to determine dosage compensation to ion beams at different positions according to the current determined by the Faraday cup. In some embodiments, effects from residual gas molecules to the current measured by the Faraday cup is reduced by using the transferring mechanism 100 in the present disclosure so as to provide accurate measurement of the ion beam profile and compensation.

The method 300 continues with operation 306 in which an ion implantation process is performed according to some embodiments. In some embodiment, a real-time dosage is also monitored using the Faraday cup coupled to the transferring system. In some embodiments, during the ion implantation process, the transferring mechanism 100 is used to move with the ion beam to different positions. In some embodiments, during the ion implantation process, the ion beam has an area which covers a doping area in a substrate and the Faraday cup, which allows the real-time dosage monitoring.

In one embodiment, a transferring system, includes: a vacuum chamber, wherein the vacuum chamber is coupled to a processing chamber; a shaft coupled to a ball screw, wherein the ball screw and the shaft are configured in the vacuum chamber; and a vacuum rotary feedthrough, wherein the vacuum rotary feedthrough comprises a magnetic fluid seal so as to provide a high vacuum sealing, and wherein the vacuum rotary feedthrough is configured through a first end of the vacuum chamber and coupled to the ball screw so as to provide a rotary motion on the ball screw.

In another embodiment, an ion implantation system, includes: a transferring system; and an ion beam measurement system, wherein the transferring system comprises: a vacuum chamber, wherein the vacuum chamber is coupled to a processing chamber; a shaft coupled to a ball screw, wherein the ball screw and the shaft are configured in the vacuum chamber; and a vacuum rotary feedthrough, wherein the vacuum rotary feedthrough comprises a magnetic fluid seal so as to provide a high vacuum sealing, wherein the vacuum rotary feedthrough is configured through a first end of the vacuum chamber and coupled to the ball screw so as to provide a rotary motion on the ball screw, and wherein the ion beam measurement system comprises a Faraday cup, wherein the Faraday cup is coupled to the shaft at a second end of the vacuum chamber.

Yet, in another embodiment, a method for performing an ion implantation process, includes: measuring an ion beam using a Faraday cup coupled to a transferring mechanism so as to transfer the Faraday cup in a processing chamber to a plurality of corresponding positions; determining a plurality of compensation dosage levels at the plurality of corresponding positions; and performing the ion implantation process with a real-time dosage monitoring using the Faraday cup coupled to the transferring mechanism, wherein the transferring system comprises: a vacuum chamber, wherein the vacuum chamber is coupled to the processing chamber; a shaft coupled to a ball screw, wherein the ball screw and the shaft are configured in the vacuum chamber; and a vacuum rotary feedthrough, wherein the vacuum rotary feedthrough comprises a magnetic fluid seal so as to provide a high vacuum sealing, wherein the vacuum rotary feedthrough is configured through a first end of the vacuum chamber and coupled to the ball screw so as to provide a rotary motion on the ball screw.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transferring system, comprising:
 a vacuum chamber, wherein the vacuum chamber is coupled to an adaptor head, which in turn is configured to be coupled to a processing chamber;
 a shaft coupled to a ball screw, wherein the ball screw and the shaft are configured in the vacuum chamber; and
 a vacuum rotary feedthrough, wherein the vacuum rotary feedthrough comprises at least one magnetic fluid seal so as to provide a vacuum seal, and wherein the vacuum rotary feedthrough is configured through a first end of the vacuum chamber and coupled to the ball screw so as to provide a rotary motion on the ball screw, and wherein the vacuum chamber comprises a viewing chamber, a sensor and a sensor bracket, wherein the sensor is configured to determine a position of a faraday cup in the processing chamber, and the sensor bracket is configured to allow adjustment of a position of the sensor along a length of the viewing window.

2. The transferring system of claim 1, wherein a vacuum level in the vacuum chamber is controlled by a vacuum system configured to be coupled to the processing chamber.

3. The transferring system of claim 1, wherein the viewing window is made from acrylic glass.

4. The transferring system of claim 1, wherein the vacuum chamber comprises an aluminum alloy.

5. The transferring system of claim 1, wherein the shaft is further configured to be coupled to the Faraday cup on a second end of the vacuum chamber, and wherein the ball screw is configured to transfer the rotary motion to a linear motion on the shaft.

6. The transferring system of claim 5, further comprising:
a mechanical motor, wherein the mechanical motor is coupled to the vacuum rotary feedthrough via a coupling mechanism; and
an electrical connection, wherein the electrical connection is configured to be coupled to the Faraday cup.

7. The transferring system of claim 1, wherein the vacuum chamber further comprises at least one Bayonet Neill Concelman (BNC) connector.

8. The transferring system of claim 7, wherein the at least one BNC connector is connectable to another element which passes through a wall of the vacuum chamber with an o-ring for maintaining a vacuum.

9. An ion implantation system, comprising:
a transferring system; and
an ion beam measurement system,
wherein the transferring system comprises: a vacuum chamber, wherein the vacuum chamber is coupled to an adaptor head, which in turn is configured to be coupled to a processing chamber;
a shaft coupled to a ball screw, wherein the ball screw and the shaft are configured in the vacuum chamber; and
a vacuum rotary feedthrough, wherein the vacuum rotary feedthrough comprises at least one magnetic fluid seal so as to provide a vacuum seal, wherein the vacuum rotary feedthrough is configured through a first end of the vacuum chamber and coupled to the ball screw so as to provide a rotary motion on the ball screw, and
wherein the vacuum chamber comprises a viewing chamber, a sensor and a sensor bracket, wherein the sensor is configured to determine a position of a faraday cup in the processing chamber, and the sensor bracket is configured to allow adjustment of a position of the sensor along a length of the viewing window.

10. The ion implantation system of claim 9, wherein a vacuum level in the vacuum chamber is controlled by a vacuum system configured to be coupled to the processing chamber.

11. The ion implantation system of claim 9, wherein the viewing window is made from acrylic glass.

12. The ion implantation system of claim 9, wherein the vacuum chamber comprises an aluminum alloy.

13. The ion implantation system of claim 9, wherein the ball screw is configured to transfer the rotary motion to a linear motion on the shaft.

14. The ion implantation system of claim 9, wherein the transferring system further comprising:
a mechanical motor, wherein the mechanical motor is coupled to the vacuum rotary feedthrough via a coupling mechanism; and
an electrical connection, wherein the electrical connection is configured to be coupled to the Faraday cup.

15. A method for performing an ion implantation process, comprising:
measuring an ion beam via a transferring system that is configured to be coupled to and to transfer a plurality of corresponding positions to a Faraday cup in a processing chamber;
determining a plurality of compensation dosage levels at the plurality of corresponding positions; and
performing the ion implantation process with a real-time dosage monitoring,
wherein the transferring system comprises:
a vacuum chamber, wherein the vacuum chamber is coupled to an adaptor head, which in turn is configured to be coupled to the processing chamber;
a shaft coupled to a ball screw, wherein the ball screw and the shaft are located and configured in the vacuum chamber; and
a vacuum rotary feedthrough, wherein the vacuum rotary feedthrough comprises at least one magnetic fluid seal so as to provide a vacuum seal,
wherein the vacuum rotary feedthrough is configured through a first end of the vacuum chamber and coupled to the ball screw so as to provide a rotary motion on the ball screw,
wherein the vacuum chamber comprises a viewing chamber, a sensor and a sensor bracket, wherein the sensor is configured to determine a position of the faraday cup in the processing chamber, and the sensor bracket is configured to allow adjustment of a position of the sensor along a length of the viewing window.

16. The method of claim 15, wherein a vacuum level in the vacuum chamber is controlled by a vacuum system configured to be coupled to the processing chamber.

17. The method of claim 15, wherein the viewing window is made from acrylic glass.

18. The method of claim 15, wherein the vacuum chamber comprises an aluminum alloy.

19. The method of claim 15, wherein the ball screw is configured to transfer the rotary motion to a linear motion on the shaft.

20. The method of claim 15, wherein the transferring system further comprises:
a mechanical motor, wherein the mechanical motor is coupled to the vacuum rotary feedthrough via a coupling mechanism; and
an electrical connection, wherein the electrical connection is configured to be coupled to the Faraday cup.

* * * * *